United States Patent
Pandey et al.

(10) Patent No.: US 6,264,750 B1
(45) Date of Patent: Jul. 24, 2001

(54) METHOD AND SYSTEM FOR FORMING SBSI THIN FILMS

(75) Inventors: Raghvendra K. Pandey, Tuscaloosa, AL (US); Kanwal K. Raina, Boise, ID (US); Narayanan Solayappan, Colorado Springs, CO (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 09/643,112

(22) Filed: Aug. 21, 2000

Related U.S. Application Data

(62) Division of application No. 09/252,121, filed on Feb. 18, 1999, now Pat. No. 6,153,262.
(60) Provisional application No. 60/078,747, filed on Feb. 19, 1998.

(51) Int. Cl.[7] .................................................. C23C 14/00

(52) U.S. Cl. ............................................ 118/724; 118/726

(58) Field of Search ..................................... 118/726, 725

(56) References Cited

PUBLICATIONS

N. Solayappan, et al.; J. Mater. Res., 12(3), pp. 825–832, 1997.
R. Nitsche and W.J. Merz, "Photoconduction in Ternary V–VI–VII Compounds," J. Phys. Chem. Solids Pergamon Press, vol. 13, pp. 154–155 (1960).
E. Fatuzzo, G. Harbeke, W.J. Merz, R. Nitsche, H. Roetschi, and W. Ruppel, "Ferroelectricity in SbSI," Phys. Rev., vol. 127, No. 6, pp. 2036–2037 (Sep. 15, 1962).
R. Nitsche, H. Roetschi, and P. Wild, "New Ferroelectric V•VI•VII Compound of the SbSI Type," Appl. Phys. Lett. vol. 4, No. 12, pp. 210–211 (Jun. 15, 1964).
L.A. Zadorozhnaya, V.A. Lyachovitskaya, E.I. Givargizov, and L.M. Belyaev, "Vapour Growth of SbSI on a Seed," J. Cryst. Growth 41, pp. 61–66 (1977).
K. Toyoda, "Electrical Properties of SbSI Crystals in the Vicinity of the Ferroelectric Curie Point," Ferroeletrics vol. 69, pp. 201–215 (1986).
E.I. Gerzanich, L.A. Lyakhovitskaya, V.M. Fridkin, and B.A. Popovkin, "Current Topics in Materials Science," edited by E. Kaldis (North–Holland Publishing Company) pp. 141–155, 1982.
J. Li, D. Viehland, A.S. Bhalla, and L.E. Cross, "Pyro–optic Studies for Infrared Imaging," J. Appl. Phys., vol. 71 (5), pp. 2106–2112 (1992).
L.E. Cross, A. Bhalla, F. Ainger, and D. Damjanovic, U.S. Patent No. 4994672, "Pyro–optic Detector and Imager," Issued Feb. 19, 1991, http://www.patents.ibm.com/details?&pn=US04994672_.
M. Yoshida, K. Yamanaka, and Y. Hamakawa, "Semiconducting and Dielectric Properties of C–Axis Oriented SbSI Thin Film," Jpn. J. Appl. Phys. vol. 12, No. 11, pp. 1699–1705 (Nov. 1973).
A. Mansingh and T. Sudarsena Rao, "Growth and Characterization of Flash–evaporated Ferroelectric antimony Sulpholodide Thin Films," J. Appl. Phys. 58 (9), pp. 3530–3535 (1985).
P.K. Ghosh, A.S. Bhalla, L.E. Cross, "Preparation and Electrical Properties of Thin Films of Antimony Sulphur Iodide (SbSI)," Ferroelectrics vol. 51, pp. 29–33 (1983).

(List continued on next page.)

*Primary Examiner*—Richard Bueker
(74) *Attorney, Agent, or Firm*—Baker Botts L.L.P.

(57) ABSTRACT

A method for forming SbSI thin films is formed. In the first step of the method, a substrate (14) is provided. Next a buffer layer (16) is formed on the substrate (14). Then, a SbSI source (12) is provided. The SbSI source (12) and buffer layer (16) with substrate (14) are placed in an ampoule (10). The ampoule is heated in a two-zone furnace (11). This causes the SbSI source (12) to form a vapor which reacts with the buffer layer (14) to form a thin film of SbSI.

18 Claims, 2 Drawing Sheets

OTHER PUBLICATIONS

S. Narayanan and R. K. Pandey, "Physical Vapor Deposition of Antimony Supho–Iodide (SbSI Thin Films and Their Properties," in Proc. 9th Int. Symp. Appln. of Ferroelectrics (University Park, PA, 1994), pp. 309–311 (also see dissertation, "Growth and Evaluation of Ferroelectric SbSI Thin Films for Thermal Imaging Applications," by Narayanan Solayappan, Texas A&M University, May 1996).

V.A. Aleshin and B.A. Popovkin, "Chemical Transport of SbSI and BiSI by Iodine and Sulphur," Neoranicheskie Materialy, vol. 26, No. 7, pp. 1391–1394, Jul. 1990.

A.I. Pankrashov, L.A. Zadorozhnaya, and E.I. Givargizov, "Oriented Crystallization of SbSI on Amorphous Substrates by Artificial Epitaxy," Sov. Phys. Crystallogr. vol. 32 (3), pp. 429–431 (May–Jun. 1987).

Bum Ki Moon and Hiroshi Ishiwara, "Roles of Buffer Layers in Epitaxial Growth of $SrTiO_3$ Films on Silicon Substrates," Jpn. J. Appl. Phys. vol. 33, pp. 1472–1477 (1994).

Joon Sung Lee, Chang Jung Kim, Dae Sung Moon, Chaun Gi Choi, Jae Myung Kim, and Kwangsoo No, "Effects of Seeding Layer on Perovskite Transformation, Microstructure and Transmittance of Sol–Gel–Processed Lanthanum––Modified Lead Zirconate Titanate Films," Jpn. J. Appl. Phys. vol. 33, pp. 260–265, Part 1, No. 1A (Jan. 1994).

P. Arun and A.G. Vedeshawar, "Phase Modification by Instantaneous Heat Treatment of $Sb_2S_3$ Films and Their Potential for Photothermal Optical Recording," J. Appl. Phys. 79 (8), pp. 4029–4036 (Apr. 15, 1996).

METHOD AND SYSTEM FOR FORMING SBSI THIN FILMS

RELATED APPLICATIONS

This application is a divisional of U.S. application Ser. No. 09/252/121, filed Feb. 18, 1999, by Raghvendra K. Pandy, et al. entitled "METHOD AND SYSTEM FOR FORMING SBSI THIN FILMS," now U.S. Pat. No. 6,153, 262, which claims the benefit of U.S. application Ser. No. 60/078,747, entitled "Method and System for Growth of Ferroelectric Antimony Sulfo-Iodide Thin Films", filed provisionally on Feb. 19, 1998.

TECHNICAL FIELD OF THE INVENTION

This invention relates to growing thin films and more specifically to a method and system for forming SbSI thin films.

BACKGROUND OF THE INVENTION

SbSI (ferroelectric antimony sulfo-iodide) in its crystal form exhibits the Curie temperature around room temperature (the Curie temperature is the temperature above which a material loses its ferroelectricity). SbSI simultaneously exhibits both semiconductor and ferroelectric properties. Although the crystal form of SbSI has been studied, SbSI thin films have not been examined as extensively. Attempts have been made to form thin films of SbSI by e-beam evaporation, flash evaporation, and thermal evaporation. These techniques have produced thin films but these thin films are nonstoichiometric and amorphous. Thus, these films fail to fully exhibit the physical properties of SbSI.

Attempts have been made to form thin films of SbSI through the use of physical vapor transport (PVT) onto a substrate, typically a Pt/Ta/SiO$_2$/Si substrate (platinum/tantalum/silicon dioxide/silicon substrate). While this technique can form thin films of SbSI, the crystal structure tends to be random in nature and thus does not fully exhibit all the desirable properties of SbSI. What is needed is a method and system for growing high quality SbSI thin films.

SUMMARY OF THE INVENTION

Accordingly, it may be appreciated that a need has arisen for a method and system for forming SbSI thin films. In accordance with the teaching of the present invention, a method and system to form SbSI thin films are provided that substantially eliminates or reduces the disadvantages of previous methods.

In one embodiment, a method for forming SbSI thin films is provided. In the first step of the method, a substrate is provided. Next a buffer layer is formed on the substrate. Then, a SbSI source is provided. The SbSI source and buffer layer with a substrate are placed in an evacuated ampoule. The ampoule is heated in a two-zone oven. This causes the SbSI source to form a vapor which reacts with the buffer layer to form a thin film of SbSI.

In another embodiment, a system for forming thin film of SbSI is provided. The system comprises an ampoule which contains an SbSI source inside at one location and a substrate with a buffer layer inside at a second location. The ampoule is placed inside a two-zone furnace, holding the SbSI source at one temperature and the buffer layer and substrate at a second, lower temperature. The furnace causes the SbSI source to vaporize and the vapor reacts with the buffer layer to form a SbSI film on the substrate.

The present invention provides various technical advantages over current methods. For example, high quality thin films of SbSI can be formed. Also, by simply changing the annealing conditions of the buffer layer, the alignment of the crystal structure of SbSI can be changed, changing physical characteristics. Additionally, a thin film of SbSI is formed with a Curie point around room temperature and a high dielectric constant at that Curie point. Other technical advantages may be readily apparent to one skilled in the art from the following figures, descriptions and claims.

BRIEF DESCRIPTION OF THE DRAWINGS

For a more complete understanding of the present invention and advantages thereof, reference is now made to the following descriptions taken in conjunction with the accompanying drawings, in which like numbers represent like parts, in which.

DETAILED DESCRIPTION OF THE INVENTION

Figure 2A:
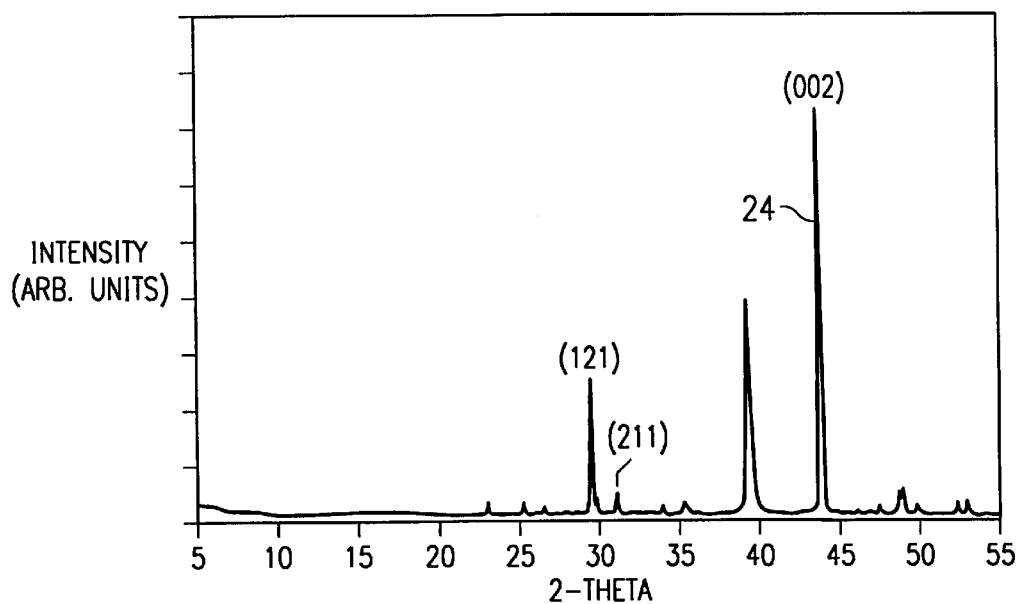
FIG. 2A is a graph of an x-ray diffraction pattern of an SbSI film with the buffer layer annealed at 250° C. for ten minutes.
Figure 2B:
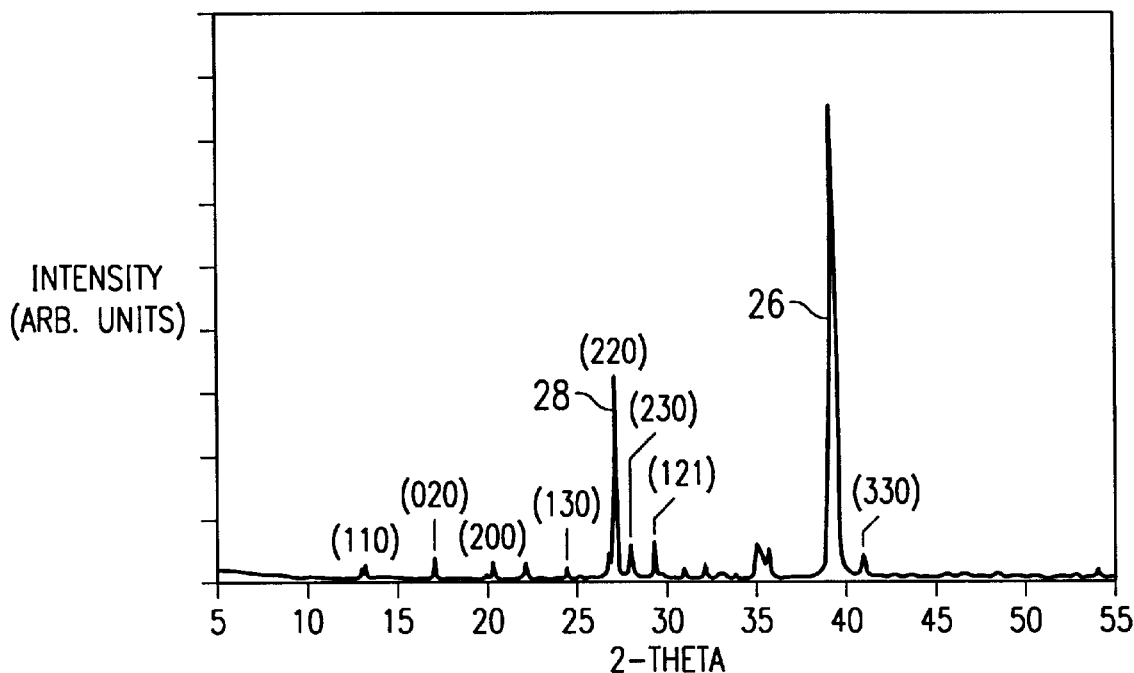
FIG. 2B is a graph of an x-ray diffraction pattern of an SbSI film with the buffer layer annealed at 300° C. for ten minutes.
Figure 3:
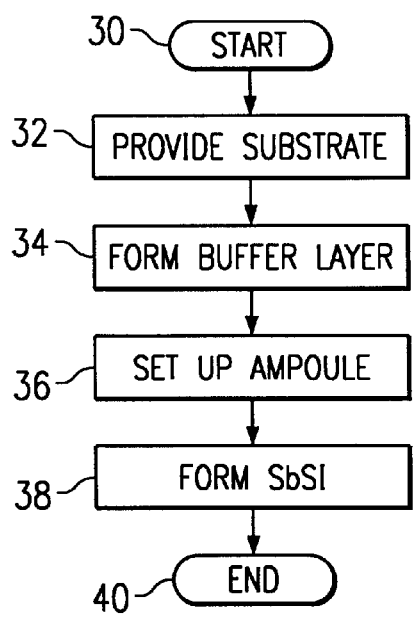
FIG. 3 is a flow chart outlining the formation of thin films of SbSI in accordance with the teachings of the present invention.

Embodiments of the present invention and its advantages are best understood by referring to FIGS. 1 through 3 of the drawings, like numerals being used for like and corresponding parts of the various drawings.

Figure 1A:
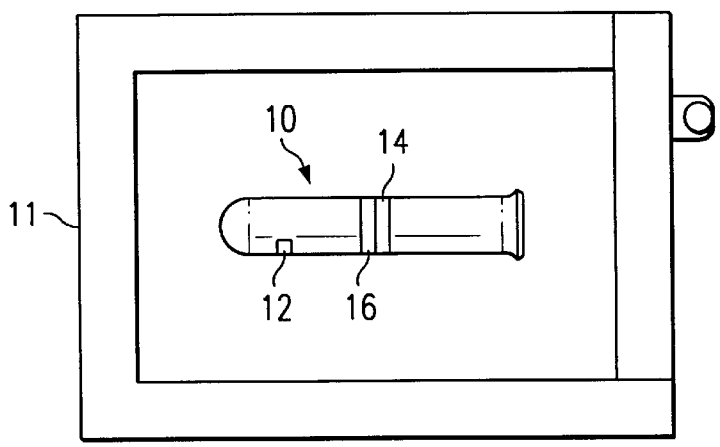
FIG. 1A illustrates a system for forming SbSI thin films in accordance with the teachings of the present invention.

FIG. 1A illustrates a system for forming thin films of SbSI in accordance with the teaching of the present invention. Illustrated in FIG. 1 is an evacuated quartz ampoule 10. Inside ampoule 10 is an SbSI source 12 consisting of, in one embodiment, stoichiometric SbSI. The SbSI source 12 is cold pressed in the form of a pellet and placed at the end of ampoule 10. Also, illustrated is a substrate 14. Substrate 14, in one embodiment, is platinized silicon (Pt/Ta/SiO$_2$/Si). Substrate 14 may also be magnesium oxide (MgO), sapphire (Al$_2$O$_3$) or any other suitable substrate. Substrate 14 is typically mounted on a quartz bead and inserted into ampoule 10 in such a way that it is perpendicular to the axis of SbSI source 12.

On top of substrate 14 on the side closest to SbSI source 12, a buffer layer 16 is formed. Buffer layer 16 is provided in order to enhance nucleation. Nucleation is the ability to form minute crystallites on the substrate. In one embodiment buffer layer 16 is formed from Sb$_2$S$_3$. Buffer layer 16 improves the crystalline orientation of the SbSI thin films, facilitates the formation of nucleation centers, and reacts with the impinging SbI$_3$ vapor during processing. The Sb$_2$S$_3$ buffer layers are thermally evaporated at room temperature onto substrate 14. Then, in one embodiment substrate 14 with buffer layer 16 are annealed at temperatures ranging from 200° to 350° Celsius for five to thirty minutes. After that substrate 14 with buffer layer 16 is placed, as mentioned above, in ampoule 10.

After ampoule 10 contains SbSI source 12 and the substrate 14 and buffer layer 16, it is placed in a gold-coated mirror furnace 11. The furnace has two different temperature zones. Thus, ampoule 10 can be held at two different temperatures with a temperature gradient between the two zones. In one embodiment SbSI source 12 is held at around 350° Celsius while the substrate/buffer combination is held at a much lower 200° Celsius with a decrease in temperature between the two areas. The high temperature causes SbSI source 12 to produce $SbI_3$ vapor which travels down the temperature gradient towards the substrate/buffer combination. Buffer layer 16 reacts with the $SbI_3$ vapor in ampoule 10 according to the following chemical reaction:

$$Sb_2S_3 + SbI_3 \rightarrow 3SbSI \qquad (1)$$

The SbSI forms on the surface of substrate 14 as a thin film. Experiments have shown that substrate 14 temperature should vary somewhere between 200° and 300° Celsius with a temperature of SbSI source 12 ranging between 250° and 350° Celsius. The reaction in Equation 1 occurs until the point where all of buffer layer 16 is converted into SbSI.

Figure 1B:
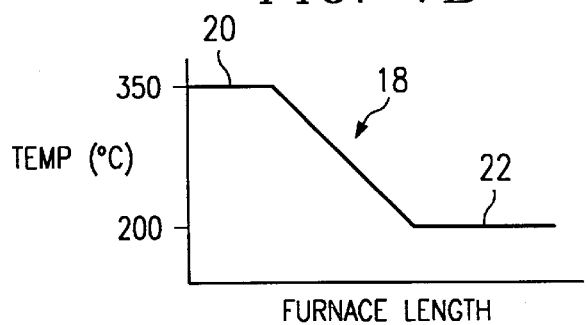
FIG. 1B is a temperature profile of the furnace in accordance with the teachings of the present invention.

FIG. 1B is a graph 18 of the temperature profile of furnace 11. Graph 18 shows that at one end of furnace 11, where SbSI source 12 is located, the temperature is higher than that where the substrate 14/buffer layer 16 combination is located.

It has been determined that the type of annealing done to buffer layer 16 can have a significant impact on the structure of the thin film after processing. Annealing the substrate 14/buffer layer 16 combination at 250° Celsius for ten minutes tends to have the crystal structure of SbSI resemble needles oriented in such a way that the crystal structure is perpendicular to the substrate. This resembles a needle-like structure coming out of the page if observed at high magnification. That is, these needles are perpendicular to the surface of the substrate. This type of orientation is desirable for the fabrication of pyroelectric devices which can be used in infrared detection. On the other hand when annealing is done at 300° Celsius for ten minutes, the resultant SbSI film has needle-like crystal structures which are parallel to the surface of the substrate. This type of orientation is useful for some ferroelectric devices such as pyro-optic devices which can be used in night vision equipment. The orientation of the crystal structure of SbSI can be determined by x-ray diffraction patterns and confirmed by scanning electron microscope pictures.

FIG. 2A is a graph of an x-ray diffraction pattern of an SbSI thin film grown on an $Sb_2S_3$ buffer layer annealed at 250° C. for ten minutes. The peaks indicate reflecting planes in the crystal structure of the SbSI film. The largest peak is known to be the peak corresponding to the c-axis of the crystal structure of SbSI. For the films which are grown on the buffer layers annealed at 250 degrees Celsius the c-axis peak is aligned at 90° with respect to the substrate.

FIG. 2B is a graph of an x-ray diffraction pattern of an SbSI thin film grown on an $Sb_2S_3$ substrate annealed at 300° C. for ten minutes. Again the peaks represent the reflecting planes in the crystal structure. In this case the largest peak is the known peak for platinum located at the substrate. The next largest peak which is indexed here as (220) peak belongs to SbSI films. In this x-ray diffraction pattern the c-axis peak is absent because it is aligned parallel to the surface of the substrate. However, its presence is confirmed by the scanning electron microscope (SEM) micrographs. They show needle-like crystallites with c-axis parallel to the substrate.

FIG. 3 is a flow chart illustrating the formation of SbSI thin films in accordance with the teaching of the present invention. At step 30 the process starts. A substrate 14 is provided at step 32. As mentioned before, the substrate 14 can be platinized silicon, magnesium oxide, sapphire, or other types of substrates. On top of the substrate a buffer layer 16 of $Sb_2S_3$ is formed in step 34. Again, the $Sb_2S_3$ buffer layer 16 is formed via thermal evaporation at room temperature and in one embodiment the size of buffer layer 16 is approximately 200 nanometers thick. The substrate/buffer layer combination is placed in an ampoule 10 in step 36 which already contains an SbSI source 12 consisting, in one embodiment, of stoichiometric SbSI. In step 38 the SbSI thin film is formed by placing ampoule 10 in a two-zone furnace which holds SbSI source 12 at a high temperature causing an $SbI_3$ vapor to form which then will react with $Sb_2S_3$ buffer layer 16 forming the SbSI thin layer. Once all of buffer layer 26 is converted, the process ends in step 40.

Of course, as discussed above, buffer layer 16 can be annealed at different temperatures to form different orientations of the SbSI crystalline structure in the thin films. Thus, depending on what physical properties that need to be enhanced, different types of annealing can take place.

Although the present invention has been described in detail, it should be understood that various changes, substitutions and alterations can be made thereto without departing from the spirit and scope of the invention as defined by the appended claims.

What is claimed is:

1. A system for forming a thin film of SbSI comprising:
   an ampoule containing:
   an SbSI source placed at one end;
   a substrate having a buffer layer formed thereupon, the substrate and buffer layer provided at a second end; and
   a two-zone furnace operable to hold the SbSI source at a higher temperature than the buffer layer such that the temperature will cause the SbSI source to form a vapor which will react with the buffer layer to form thin films of SbSI.

2. The system of claim 1, wherein the buffer layer is $Sb_2S_3$.

3. The system of claim 1, wherein the SbSI source is stoichiometric SbSI.

4. The system of claim 1, wherein the buffer layer is annealed to the substrate.

5. The system of claim 4, wherein the amount of annealing determines the crystalline structure of SbSI.

6. The system of claim 4, wherein the buffer layer is annealed at 250° C. for ten minutes to cause the c-axis of the SbSI film to align perpendicular to the substrate.

7. The system of claim 4, wherein the buffer layer is annealed at 300° C. for ten minutes to cause the c-axis of the SbSI film to align parallel to the substrate.

8. The system of claim 1, wherein the substrate comprises Pt/Ta/SiO$_2$/Si.

9. A system for forming a thin film of SbSI, comprising:
   a container;
   an SbSI source disposed at a first position within the container;
   a substrate disposed at a second position within the container, the first position spaced apart from the second position, the substrate having a buffer layer formed thereon; and
   a furnace operable to receive the container, the furnace operable to maintain the SbSI source at a predetermined temperature, the predetermined temperature operable to form a vapor from the SbSI source, the vapor reacting with the buffer layer to form the thin film of SbSI.

10. The system of claim 9, wherein the substrate is disposed within the container perpendicular to an axis of the SbSI source.

11. The system of claim 9, wherein the buffer layer is disposed on a side of the substrate closest to the SbSI source.

12. The system of claim 9, wherein the furnace comprises a dual zone furnace operable to maintain a temperature gradient between the SbSI source and the substrate, and wherein the vapor travels down the temperature gradient toward the substrate.

13. The system of claim 9, wherein the buffer layer comprises $Sb_2S_3$.

14. The system of claim 9, wherein the SbSI source comprises stoichiometric SbSI.

15. The system of claim 9, wherein the substrate and the buffer layer comprise an annealed substrate/buffer layer combination.

16. The system of claim 15, wherein the combination is annealed at a temperature of between 200° and 300° Celsius.

17. The system of claim 16, wherein the annealed temperature is selected to product a predetermined orientation of a crystal structure of the thin film of SbSI.

18. The system of claim 9, wherein the buffer layer is formed on the substrate by thermally evaporating the buffer layer onto the substrate.

* * * * *

UNITED STATES PATENT AND TRADEMARK OFFICE
CERTIFICATE OF CORRECTION

PATENT NO. : 6,264,750 B1  Page 1 of 1
DATED : July 24, 2001
INVENTOR(S) : Raghvendra K. Pandey et al.

It is certified that error appears in the above-identified patent and that said Letters Patent is hereby corrected as shown below:

Title page,
Item [54] Title, Column 1, "FORMING", delete "SBSI", and insert -- SbSI --.

Signed and Sealed this

Twenty-sixth Day of February, 2002

Attest:

JAMES E. ROGAN
Attesting Officer  Director of the United States Patent and Trademark Office